United States Patent
Chen et al.

(10) Patent No.: US 10,566,365 B2
(45) Date of Patent: Feb. 18, 2020

(54) IMAGE SENSOR

(71) Applicant: VisEra Technologies Company Limited, Hsin-Chu (TW)

(72) Inventors: Li-Wei Chen, Jhudong Township, Hsinchu County (TW); Chi-Han Lin, Zhubei (TW); Zong-Ru Tu, Keelung (TW)

(73) Assignee: VISERA TECHNOLOGIES COMPANY LIMITED, Hsinchu (TW)

( * ) Notice: Subject to any disclaimer, the term of this patent is extended or adjusted under 35 U.S.C. 154(b) by 783 days.

(21) Appl. No.: 14/722,730

(22) Filed: May 27, 2015

(65) Prior Publication Data

US 2016/0351610 A1    Dec. 1, 2016

(51) Int. Cl.
*H01L 27/146* (2006.01)

(52) U.S. Cl.
CPC .. *H01L 27/14627* (2013.01); *H01L 27/14621* (2013.01); *H01L 27/14623* (2013.01)

(58) Field of Classification Search
CPC ......... H01L 27/14627; H01L 27/14623; H01L 27/14621; H01L 27/1464; G02B 3/0037
See application file for complete search history.

(56) References Cited

U.S. PATENT DOCUMENTS

| | | | |
|---|---|---|---|
| 2005/0205956 A1 | 9/2005 | Oda | |
| 2010/0009493 A1* | 1/2010 | Kim | H01L 27/14621 438/69 |
| 2011/0221947 A1* | 9/2011 | Awazu | G02B 3/0043 348/311 |
| 2012/0147208 A1* | 6/2012 | Otsuka | H01L 27/14621 348/222.1 |
| 2013/0307107 A1* | 11/2013 | Tsai | H01L 27/14621 257/432 |
| 2015/0061061 A1* | 3/2015 | Wang | H01L 31/02327 257/432 |
| 2015/0084144 A1* | 3/2015 | Suzuki | H01L 27/1463 257/432 |
| 2015/0244951 A1* | 8/2015 | Oishi | H01L 27/14621 348/243 |

FOREIGN PATENT DOCUMENTS

| | | |
|---|---|---|
| CN | 1591883 A | 3/2005 |
| CN | 102047427 A | 5/2011 |
| CN | 102315232 A | 1/2012 |
| CN | 104167420 A | 11/2014 |
| TW | 201126703 A | 8/2011 |
| TW | 201401494 A | 1/2014 |
| TW | 201445716 A | 12/2014 |

OTHER PUBLICATIONS

Taiwanese Office Action dated Aug. 9, 2016, as issued in corresponding Taiwan Patent Application No. 104138011 (7 pages).
An Office Action issued in corresponding CN Application No. 201510872230.1 dated Jul. 30, 2018.

* cited by examiner

*Primary Examiner* — Su C Kim
(74) *Attorney, Agent, or Firm* — Muncy, Geissler, Olds & Lowe, P.C.

(57) ABSTRACT

An image sensor includes a sensing layer, a first microlens, and a number of second microlenses. The first microlens is disposed on the sensing layer. The second microlenses are disposed on the sensing layer adjacent to the first microlens. The diameter of the first microlens is greater than the diameter of each of the second microlenses.

5 Claims, 7 Drawing Sheets

IMAGE SENSOR

BACKGROUND OF THE INVENTION

Field of the Invention

The present disclosure relates to an image sensor, and in particular to an image sensor having microlenses with different sizes.

Description of the Related Art

In general, a digital camera utilizes an image sensor to sense light and generate an image signal, and thus a picture taken by the digital camera can be generated according to the image signal.

With the development of digital cameras, image signals of high quality are required. The image sensors using backside illumination (BSI) technology have light pipe structures to guide light to photodiodes for great photosensitivity and higher image quality.

Although image sensors have been generally adequate for their intended purposes, they have not been entirely satisfactory in all respects. Consequently, it is desirable to provide a solution for improving image sensors.

BRIEF SUMMARY OF THE INVENTION

The present disclosure provides image sensors for improving the quality of image signals generated by the image sensors.

The present disclosure provides an image sensor including a sensing layer, a first microlens, and a number of second microlenses. The first microlens is disposed on the sensing layer. The second microlenses are disposed on the sensing layer adjacent to the first microlens. The diameter of the first microlens is greater than the diameter of each of the second microlenses.

The present disclosure provides an image sensor including a sensing layer and a microlens array. The microlens array is disposed on the sensing layer, and includes a number of first microlenses disposed on the sensing layer, and a number of second microlenses disposed on the sensing layer adjacent to the first microlenses. The first microlenses have a plurality of first diameters that gradually increase from the central area of the microlens array to the edge of the microlens array. The second microlenses have a plurality of second diameters, and the first diameters of the first microlenses in the edge area are greater than the second diameters of the second microlenses in the edge area.

In conclusion, since the diameter of the first microlens is greater than the diameter of the second microlenses, the quantity of light passing through the first microlens is greater than the quantity of light passing through the second microlens. Thus, the quantum efficiency of a specific color, such as green, relative to the first microlens is improved, and the image quality of the image sensor is improved accordingly.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
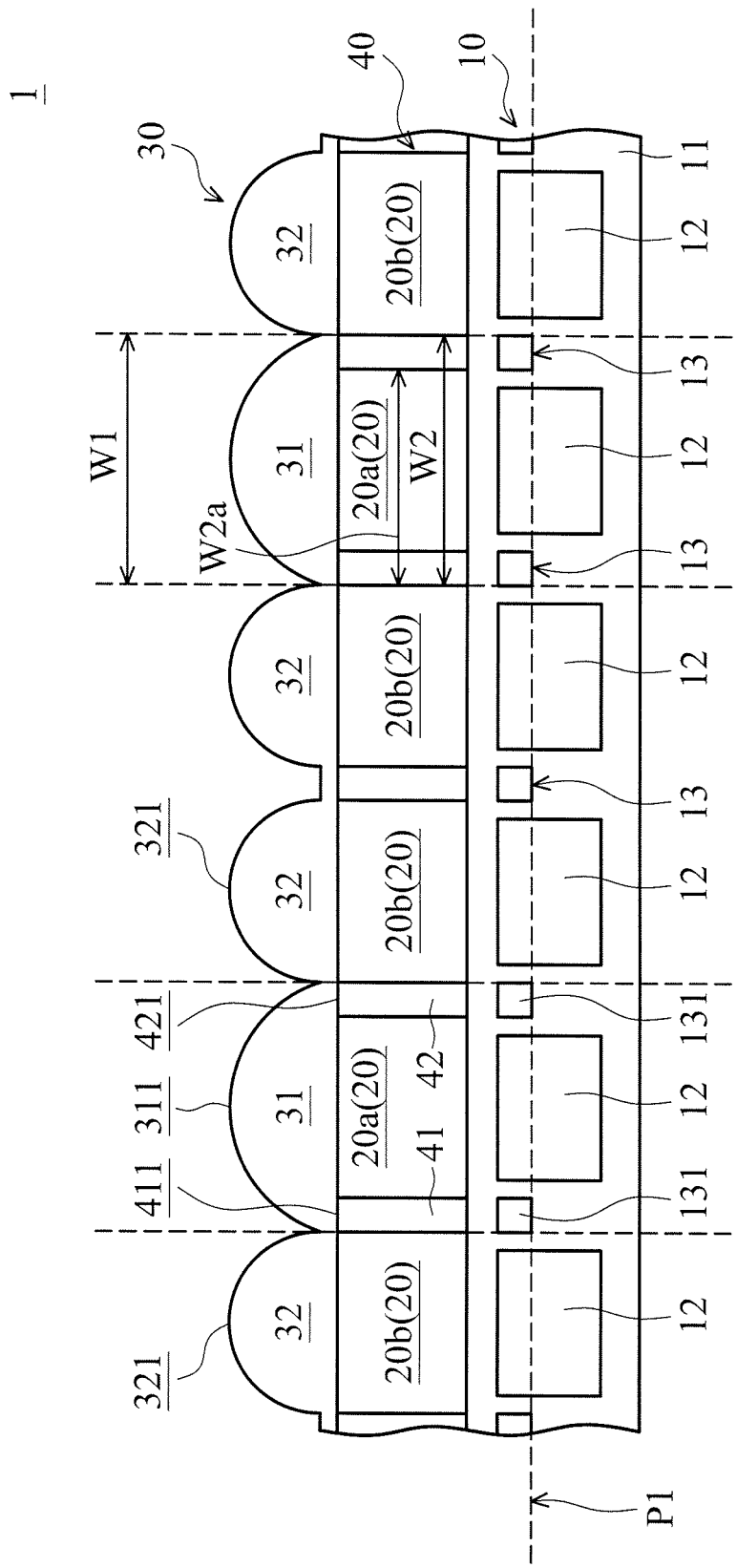
FIG. 1 is a schematic view of an image sensor in accordance with a first embodiment of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale or simplified for clarity of discussion; rather, these drawings are merely intended for illustration.

Figure 2:
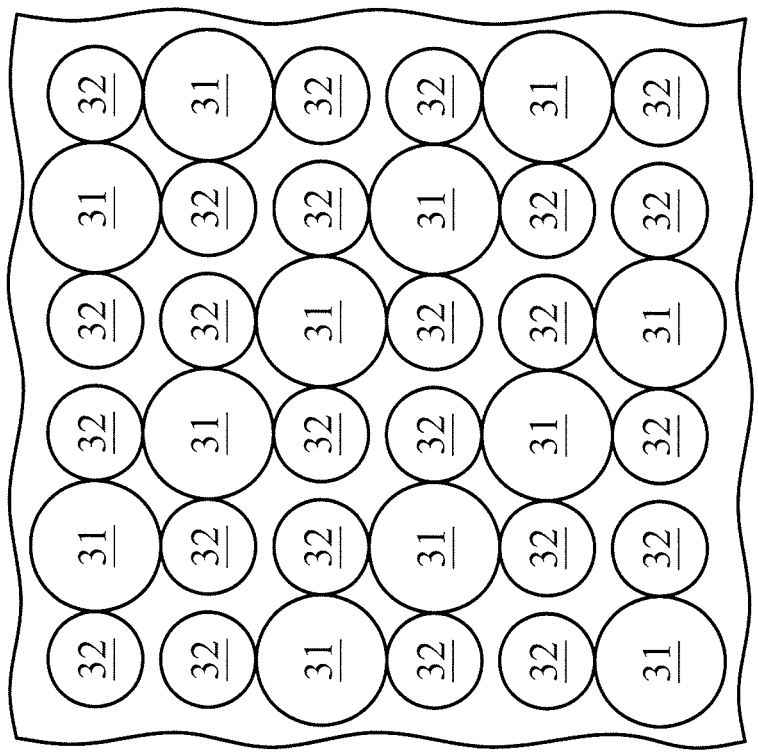
FIG. 2 is a top view of the image sensor in accordance with the first embodiment of the present disclosure.

FIG. 1 is a schematic view of an image sensor 1 in accordance with a first embodiment of the present disclosure. FIG. 2 is a top view of the image sensor 1 in accordance with the first embodiment of the present disclosure. The image sensor 1 is configured to capture an image. The image sensor 1 can be applied to an imaging apparatus, such as a digital camera. The type of the image sensor 1 is varied. In some embodiments, the image sensor 1 is a CMOS (Complementary Metal-Oxide-Semiconductor) sensor, a BSI (backside illumination) CMOS sensor, or another suitable sensor.

The image sensor 1 includes a sensing layer 10, a number of filter units 20, a microlens array 30, and a grid structure 40. The sensing layer 10 extends along a reference plane P1. The sensing layer 10 is configured to detect incident light and generate an image signal according to the light falling on the sensing layer 10.

The sensing layer 10 may include all of the following elements, but it is not necessary for the sensing layer 10 to include all of the following elements since the object of the sensing layer 10 is achieved. The sensing layer 10 includes a substrate 11, a number of sensing units 12, and a blocking structure 13. In some embodiments, the sensing layer 10 further includes other optional layers, such as an anti-reflection layer (not shown in figures).

The sensing units 12 are disposed in the substrate 11. The sensing units 12 are arranged in an array at the reference plane P1. In some embodiments, the sensing units 12 are photodiodes. Each of the sensing units 12 is configured to sense light and generate an intensity signal according to the intensity of the light falling thereon. The image signal is formed by the intensity signals. In some embodiments, the sensing units 12 have the same spacing.

The blocking structure 13 is around the sensing units 12 and under the grid structure 40. The blocking structure 13 comprises a plurality of blocking portions 131 with the same spacing. The sensing unit 12 is located between two adjacent blocking portions 131. The blocking portions 131 are configured to block light.

The filter units 20 are disposed on the sensing layer 10. The filter units 20 are arranged in an array on a plane parallel to the reference plane P1. Each of the filter units 20 is disposed over one of the sensing units 12.

Each of the filter units 20 allows a predetermined range of wavelengths of light to pass. In some embodiments, the filter units 20 are color filter units 20. The filter units 20 include a number of first filter units 20a and a number of second filter units 20b. The first filter units 20a and the second filter units 20b are alternately arranged in an array.

In this embodiment, the cross sections, perpendicular to the sensing layer 10, of the first filter units 20a and the second filter units 20b are rectangular. The volume of the first filter unit 20a is equal to the volume of the second filter unit 20b, and the width of the first filter unit 20a is equal to the width of the second filter units 20b.

In some embodiments, the first filter units 20a are green filter units. The second filter units 20b are red filter units or blues filter units. For example, the red filter units 20 allow wavelengths of light in a range from 620 nm to 750 nm (red light) to pass to the sensing units 12. The green filter units 20 allow wavelengths of light in a range from 495 nm to 570 nm (green light) to pass to the sensing units 12. The blue filter units 20 allow wavelengths of light in a range from 476 nm to 495 nm (blue light) to pass to the sensing units 12.

The microlens array 30 is disposed on the sensing layer 10 and the filter units 20, and parallel to the reference plane P1. The grid structure 40 is connected to and around the first filter units 20 and the second filter units 20b. The grid structure 40 contacts the sensing layer 10, and is parallel to the reference plane P1.

In some embodiments, the refractive index of the grid structure 40 is lower than the refractive index of the filter units 20, and thus the filter units 20 and the grid structure 40 form a light pipe structure. The grid structure 40 is configured to reflect the light in the filter units 20 toward the sensing units 12.

In some embodiments, the grid structure 40 includes a refractive index in a range from about 1.3 to 1.9. The filter unit includes a refractive index in a range from about 1.7 to 3.2. The grid structure 40 includes propylene, polysiloxane or a combination thereof. In some embodiments, the grid structure 40 includes at least 70 wt % propylene, polysiloxane or a combination thereof.

In some embodiments, the grid structure 40 includes a number of first grids 41 and a number of second grids 42. The first filter unit 20a is connected to and located between the first grid 41 and the second grid 42. The first grids 41 and the second grids 42 are parallel to each other, and perpendicular to the sensing layer 10. The first grids 41 and the second grids 42 are arranged alternately with the same spacing. Each of the first grids 41 and the second grids 42 is disposed over one of the blocking portions 131.

When a light falls on the image sensor 1, the light passes through the microlens array 30 and the filter units 20 to the sensing units 12. The light is focused by the microlens array 30. Each of the filter units 20 allows a predetermined range of wavelengths of light to pass. Each of the sensing units 12 generates an intensity signal according to the intensity of the light falling thereon, and the image signal is formed by the intensity signals.

In this embodiment, the microlens array 30 includes a number of first microlenses 31 and a number of second microlenses 32. As shown in FIG. 2, the first microlenses 31 and the second microlenses 32 of the microlens array 30 are arranged in an array on a plane parallel to the reference plane P1. The arrangement and the size of the first microlenses 31 and the second microlenses 32 are varied. In this embodiment, the first microlenses 31 and the second microlenses 32 are disposed on the sensing layer 10 and arranged alternately in an array. The second microlenses 32 are adjacent to the first microlens 31. In some embodiments, the second microlenses 32 are around the first microlens 31. The first microlenses 31 and the second microlenses 32 are configured to focus the light to the sensing units 12.

Each of the first microlenses 31 is disposed on one of the first filter units 20a, and each of the second microlenses 32 is disposed on one of the second filter units 20b. In other words, the first filter units 20a are located between the first microlenses 31 and the sensing units 12 of the sensing layer 10, and the second filter units 20b are located between the second microlenses 32 and the sensing units 12 of the sensing layer 10.

The area of the first irradiated surface 311 of the first microlens 31 is greater than the area of the second irradiated surface 321 of the second microlens 32, and the diameter of the first microlens 31 is greater than the diameter of the second microlens 32.

In some embodiments, the first irradiated surface 311 of the first microlens 31 is greater than the second irradiated surface 321 of the second microlens 32, and the diameter of the first microlens 31 is greater than the diameter of each of the second microlenses 32.

In some embodiments, the first grid 41 has a top surface 411, and the second grid 42 has a top surface 421. The top surface 411 and the top surface 421 are completely covered by the first microlens 31. The diameter W1 of the first microlens 31 is equal to or substantially equal to the combined widths W2 of the first grid 41, the first filter unit 20a and the second grid 42. In other words, the diameter W1 of the first microlenses 31 is equal to or greater than the combined widths W2a of the first grid 41 (or the second grid 42) and the first filter unit 20a.

By the structure of the first microlenses 31 and the second microlenses 32, the quantity of light passing through the first microlenses 31 and the first filter units 20a is greater than the quantity of light passing through the second microlenses 32 and the second filter units 20b. Thus, the quantum efficiency of a specific color, such as green, relative to the first microlenses 31 and the first filter units 20a is improved.

In some embodiments, the first filter units 20a are green filter units. The quantum efficiency of green light of the sensing units 12 is improved. The quality of green color of an image generated by the image sensor 1 is improved. Since humans are sensitive to the color green, the image quality of the image is improved.

Figure 3:
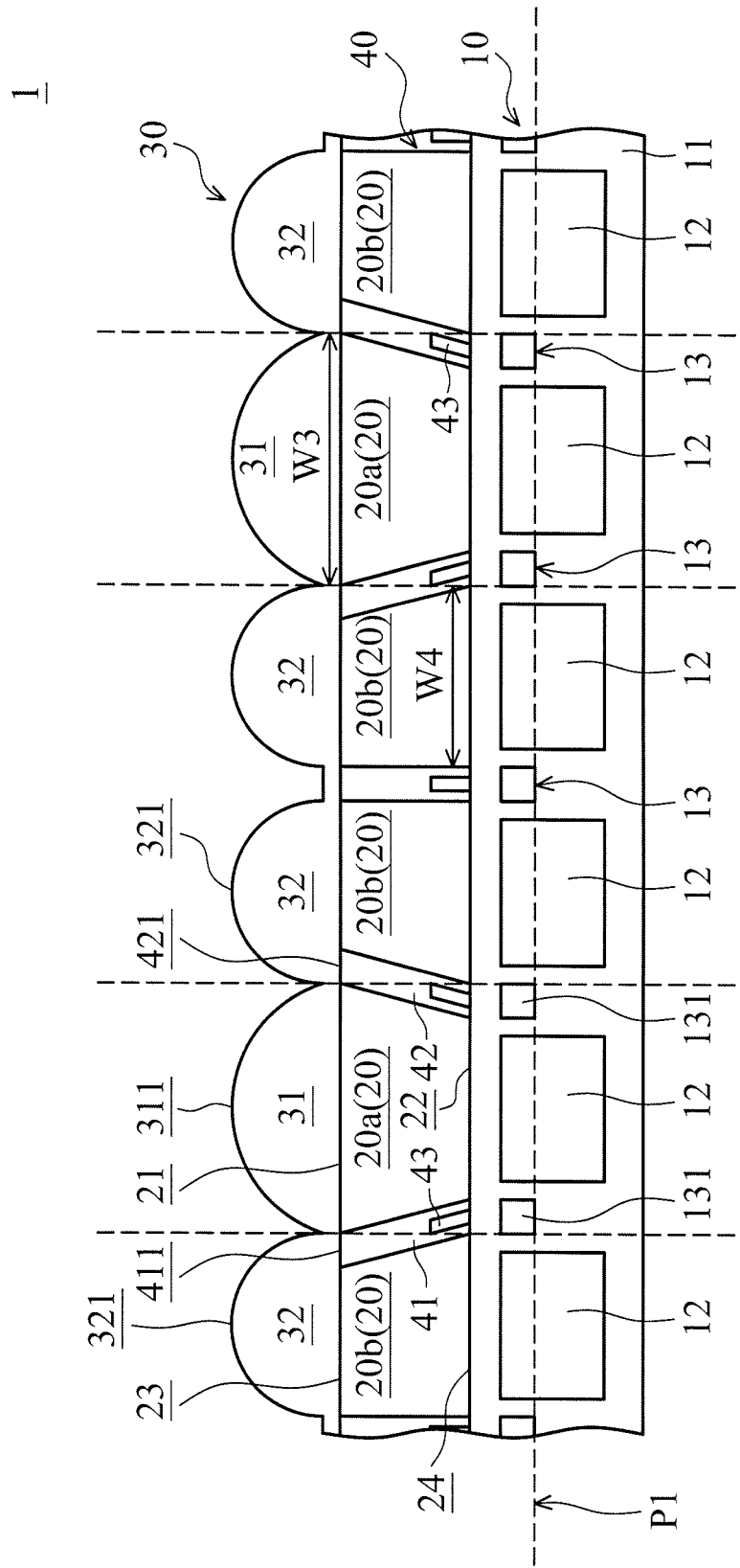
FIG. 3 is a schematic view of an image sensor in accordance with a second embodiment of the present disclosure.

FIG. 3 is a schematic view of an image sensor 1 in accordance with a second embodiment of the present disclosure. The first grid 41 and the second grid 42 are inclined relative to the sensing layer 10, and the first grid 41 and the second grid 42 are symmetrical about a center of the first filter unit 20a. In some embodiments, the angle between the first grid 41 (or the second grid 42) and the sensing layer 10 is in a range from about 60 degrees to about 85 degrees. The top surface 411 and the top surface 421 are completely covered by the second microlenses 32.

The cross section, perpendicular to the sensing layer 10, of the first filter unit 20a is trapezoidal. The first filter unit 20a is gradually narrow from the top surface 21 to the bottom surface 22 of the first filter unit 20a. In other words, the area of the top surface 21 is greater than the area of the bottom surface 22. The top surface 21 is connected to the first microlens 31, and the bottom surface 22 is connected to the sensing layer 10.

The cross section, perpendicular to the sensing layer 10, of the second filter unit 20b is trapezoidal. The second filter unit 20b is gradually narrow from the bottom surface 24 to the top surface 23. In other words, the area of the bottom surface 22 is greater than the area of the top surface 23. The top surface 21 is connected to the first microlens 31, and the bottom surface 22 is connected to the sensing layer 10.

The volume of the first filter unit 20a is greater than the volume of the second filter unit 20b. The greatest width W3 of the first filter unit 20a is greater than the greatest width W4 of the second filter unit 20b.

By the structure of the filter units 20, the first microlenses 31 and the second microlenses 32, and the grid structure 40, the quantity of light passing through the first filter unit 20a is greater than the quantity of light passing through the second filter unit 20b.

The grid structure 40 further includes a shielding portion 43 in the first grid 41 and the second grid 42. The shielding portion 43 includes HfOx, $SiO_2$, low index organic material or a combination thereof. In some embodiments, the shielding portion 43 includes at least 70 wt % HfOx, $SiO_2$, low index organic material or a combination thereof. The shielding portion 43 includes a refractive index in a range from about 1.3 to 1.9. In some embodiments, the shielding portion 43 has a transmittance lower than 30%, and the first grids 41 and the second grids 42 have transmittances greater than 80% or 90%.

In some embodiments, the shielding portion 43 contacts the sensing layer 10. The length of the shielding portion 43 is shorter than the length of the first grid 41 (or second grid 42). The shielding portion 43 is configured to shield the light passing through. Therefore, the light, in the first filter unit 20a, transmitted to the second filter unit 20b is decreased.

Figure 4:
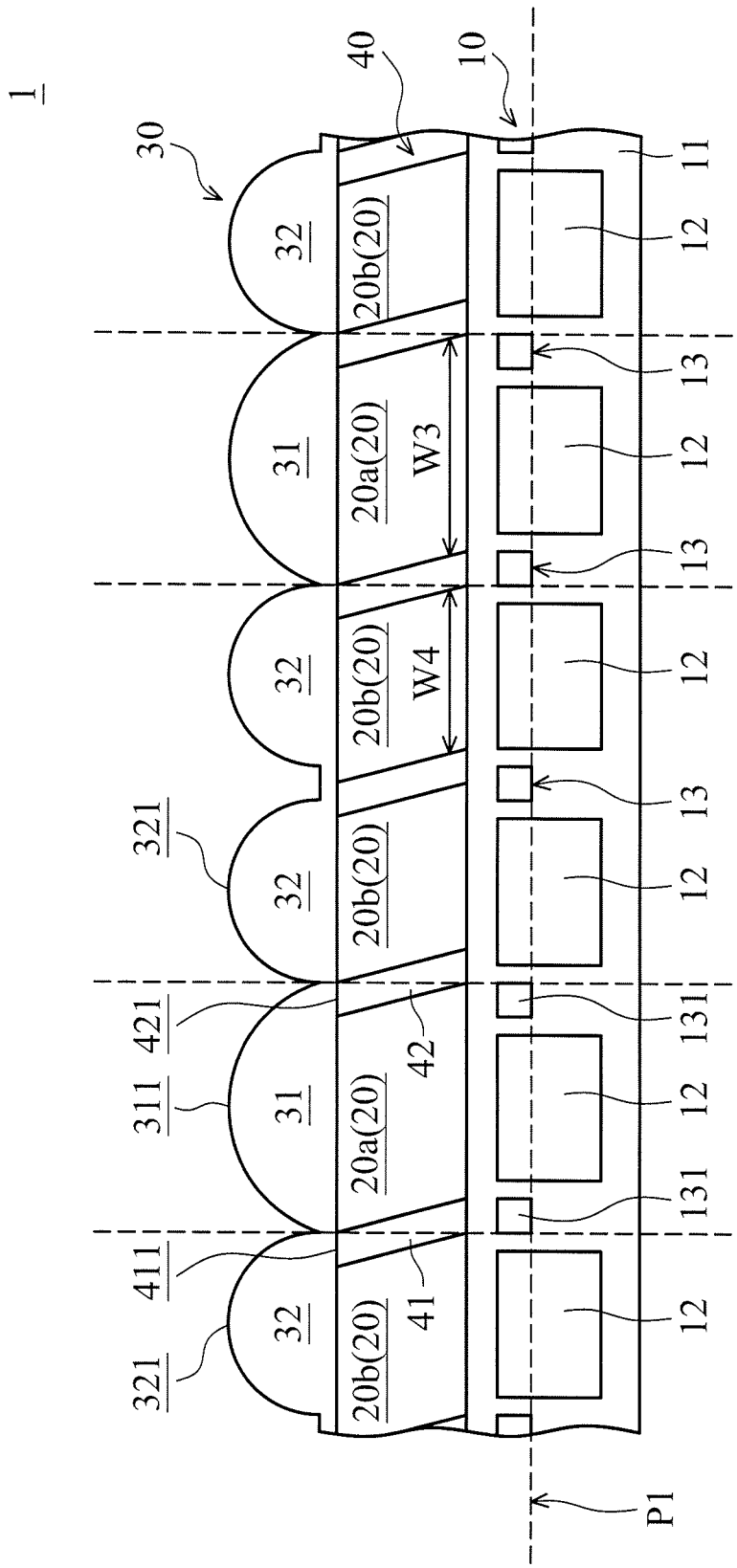
FIG. 4 is a schematic view of an image sensor in accordance with a third embodiment of the present disclosure.

FIG. 4 is a schematic view of an image sensor 1 in accordance with a third embodiment of the present disclosure. The cross section, perpendicular to the sensing layer 10, of the first filter unit 20a is a parallelogram. The first grid 41 and the second grid 42 are inclined relative to the sensing layer 10, and the first grid 41 and the second grid 42 are parallel to each other. In some embodiments, the angle between the first grid 41 (or the second grid 42) and the sensing layer 10 is in a range from about 60 degrees to about 85 degrees.

The top surface 411 is completely covered by the second microlens 32, and the top surface 421 is completely covered by the first microlens 31. The greatest width W3 of the first filter unit 20a is greater than the greatest width W4 of the second filter unit 20b.

By the structure of the filter units 20, the first microlenses 31 and the second microlenses 32, and the grid structure 40, the quantity of light passing through the first filter unit 20a is greater than the quantity of light passing through the second filter unit 20b.

Figure 5:
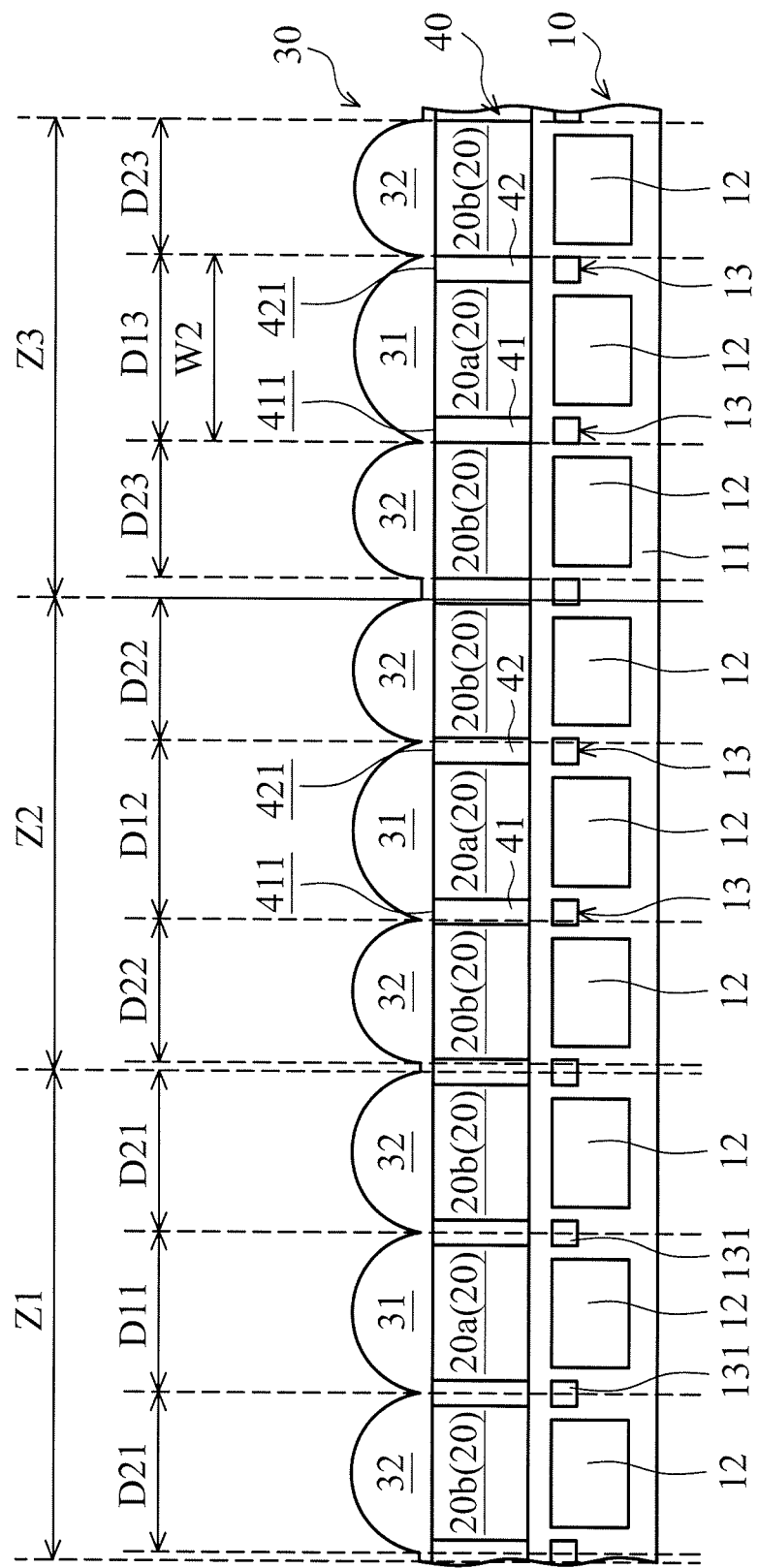
FIG. 5 is a schematic view of an image sensor in accordance with a fourth embodiment of the present disclosure.

FIG. 5 is a schematic view of an image sensor 1 in accordance with a fourth embodiment of the present disclosure. In this embodiment, cross sections, perpendicular to the sensing layer 10, of the first filter units 20a are rectangular. The volumes of the first filter units 20a and the second filter units 20b are the same, and the width of the first filter units 20a is equal to the width of the second filter units 20b. The first grids 41 and the second grids 42 are parallel to each other, and perpendicular to the sensing layer 10.

The diameters of the first microlenses 31 gradually increase from the central area Z1 of the microlens array 30 to the edge area Z3 of the microlens array 30. In other words, the diameter D13 of the first microlenses 31 in the edge area Z3 is greater than the diameter D12 of the first microlens 31 in the middle area Z2, and the diameter D12 of the first microlenses 31 in the middle area Z2 is greater than the diameter D11 of the first microlens 31 in the central area Z1.

The diameters D11 of the first microlenses 31 in the central area Z1 are greater than or equal to the diameters D21 of the second microlenses 32 in the central area. The diameters D12 of the first microlenses 31 in the middle area Z2 are greater than the diameters D22 of the second microlenses 32 in the middle area Z2. The diameters D13 of the first microlenses 31 in the edge area Z3 are greater than the diameters D23 of the second microlenses 32 in the edge area Z3.

By the structure of the first microlenses 31 and the second microlenses 32, the quantity of light passing through the first microlenses 31 in the central area Z1, the middle area Z2, and the edge area Z3 is uniform, and thus the quality of the image generated by the image sensor 1 is improved.

Figure 6:
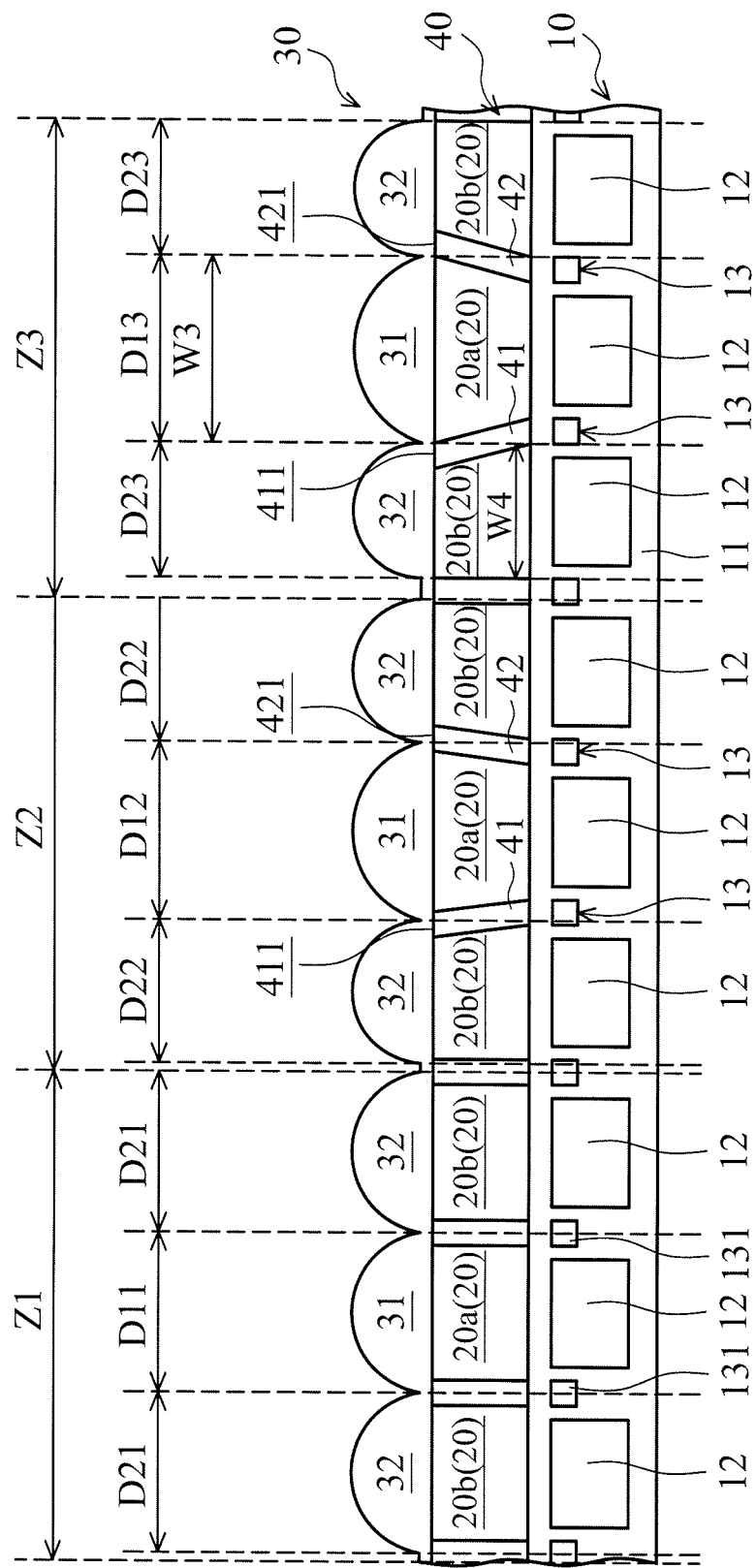
FIG. 6 is a schematic view of an image sensor in accordance with a fifth embodiment of the present disclosure.

FIG. 6 is a schematic view of an image sensor 1 in accordance with a fifth embodiment of the present disclosure. In this embodiment, the cross sections, perpendicular to the sensing layer 10, of the first filter units 20a in the middle area Z2 and the edge area Z3 are trapezoidal. In some embodiments, the cross sections, perpendicular to the sensing layer 10, of the first filter units 20a in the central area Z1 are rectangular or trapezoidal.

The volumes of the first filter units 20a gradually increase from the central area Z1 of the microlens array 30 to the edge area Z3 of the microlens array 30. The greatest width W3 of the first filter unit 20a in the edge area Z3 (and the middle area Z2) is greater than the greatest width W4 of the adjacent second filter units 20b in the edge area Z3 (and the middle area Z2). The volumes of the first filter units 20a in the edge area Z3 is greater than the volumes of the second filter units 20b in the edge area Z3.

The first grids 41 and the second grids 42 in the central area Z1 are parallel to or inclined relative to each other, and perpendicular to the sensing layer 10. The first grids 41 and the second grids 42 in the middle area Z2 and the edge area Z3 are inclined relative to the sensing layer 10, and one of the first grids 41 and one of the second grids 42 are symmetrical about the center of one of the first filter units 20a.

The distance between each first grid 41 and the adjacent second grid 42 gradually increases from the central area Z1 to the edge area Z3. The top surfaces 411 and the top surfaces 421 are completely covered by the second microlenses 32 in the edge area Z3.

Figure 7:
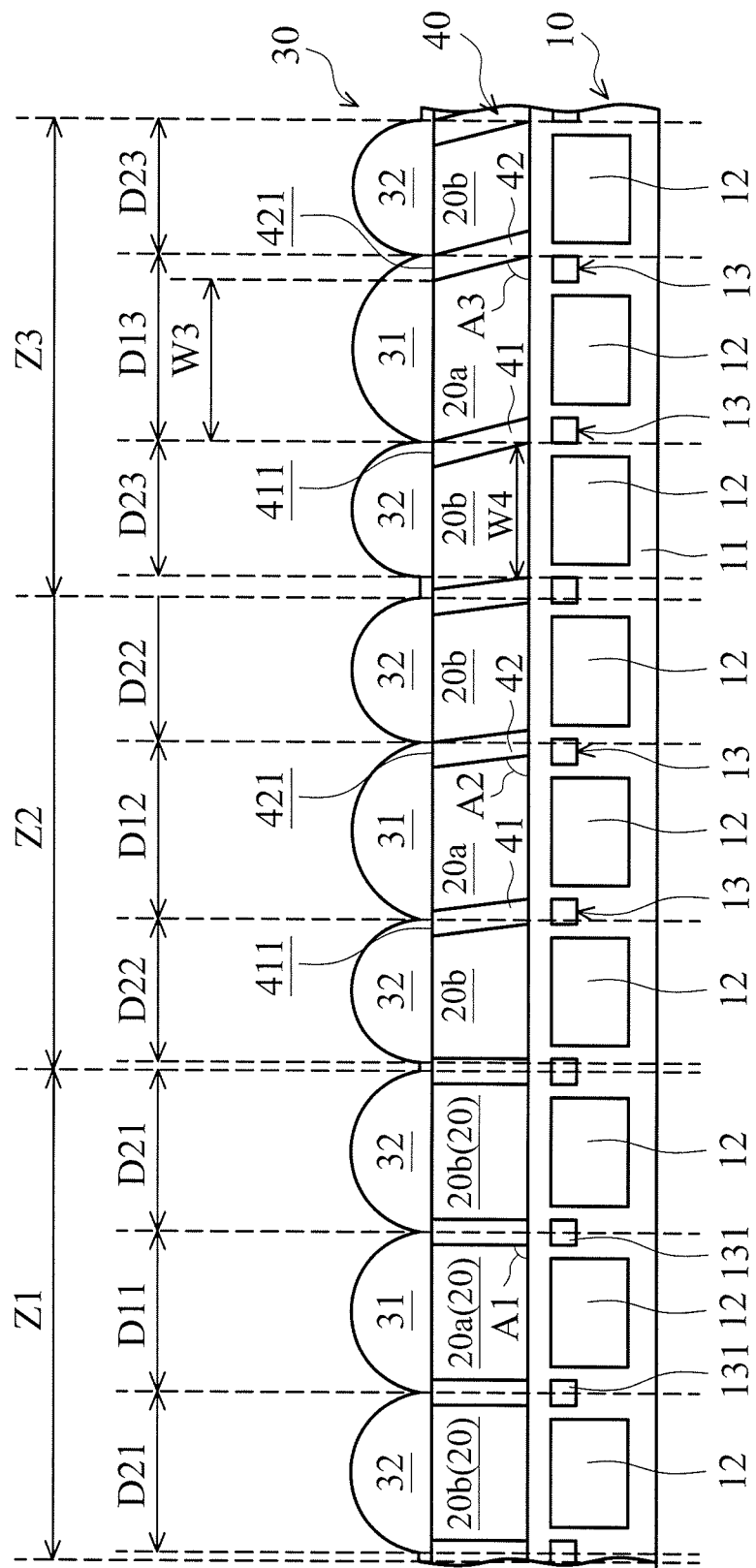
FIG. 7 is a schematic view of an image sensor in accordance with a sixth embodiment of the present disclosure.

FIG. 7 is a schematic view of an image sensor 1 in accordance with a sixth embodiment of the present disclosure. In this embodiment, cross sections, perpendicular to the sensing layer 10, of the first filter units 20a in the middle area Z2 and the edge area Z3 are parallelograms. In some embodiments, the cross sections, perpendicular to the sensing layer 10, of the first filter units 20a in the central area Z1 are rectangular or parallelograms.

The angles A1, A2 and A3 between the first grids 41 and the sensing layer 10 gradually increase from the central area Z1 to the edge area Z3. In some embodiments, the angle A1 is in a range from about 80 degrees to about 90 degrees, the angle A2 is in a range from about 70 degrees to about 85 degrees, and the angle A3 is in a range from about 60 degrees to about 80 degrees.

The first grids 41 and the second grids 42 in the central area Z1 are parallel to each other, and perpendicular to the sensing layer 10. The first grids 41 and the second grids 42 in the middle area Z2 and the edge area Z3 are inclined relative to the sensing layer 10, and parallel to each other.

The top surfaces 411 are completely covered by the second microlenses 32 in the edge area Z3, and the top surfaces 421 are completely covered by the first microlenses 31 in the edge area Z3.

By the structure of the microlenses 30 and the filter units 20, the quantity of light passing through the first microlenses 31 in the central area Z1, the middle area Z2, and the edge area Z3 in the fifth and sixth embodiments is uniform, and the quantity of light passing through the first microlenses 31 and the first filter units 20a in the middle area Z2 and the edge area Z3 is increased. Therefore the quality of the image generated by the image sensor 1 is improved.

In conclusion, since the diameter of the first microlens is greater than the diameter of the second microlenses, the quantity of light passing through the first microlens is greater than the quantity of light passing through the second microlens. Thus, the quantum efficiency of a specific color, such as green, relative to the first microlens is improved, and the image quality of the image sensor is improved accordingly.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
a sensing layer;
a plurality of first filter units located between the first microlenses and the sensing layer;
a plurality of second filter units, located between the second microlenses and the sensing layer;
a grid structure connected to and around the first filter units and the second filter units, wherein the grid structure comprises a plurality of first grids and a plurality of second grids, wherein each of the first filter units is connected to and located between one of the first grids and one of the second grids; and
a microlens array, disposed on the sensing layer, comprising:
a plurality of first microlenses disposed on the sensing layer; and
a plurality of second microlenses disposed on the sensing layer adjacent to the first microlenses;
wherein the first microlenses have a plurality of first diameters that gradually increase from a central area of the microlens array to an edge area of the microlens array,
wherein the second microlenses have a plurality of second diameters, and the first diameters of the first microlenses in the edge area are greater than the second diameters of the second microlenses in the edge area,
wherein first cross sections of the first grids and second cross sections of the second grids perpendicular to the sensing layer are elongated, the first cross sections and the second cross sections respectively extend along two directions, which are inclined relative to the sensing layer in the edge area, and one of the first cross sections and one of the second cross sections are reflectionally symmetrical about a center of one of the first filter units.

2. The image sensor as claimed in claim 1, wherein greatest widths of the first filter units in the edge area are greater than greatest widths of the second filter units in the edge area.

3. The image sensor as claimed in claim 1, wherein a distance between each first grid and one of the adjacent second grids gradually increases from the central area to the edge area.

4. The image sensor as claimed in claim 1, wherein angles between the first grids and the sensing layer gradually increase from the central area to the edge area.

5. The image sensor as claimed in claim 1, wherein a width of the first microlens is substantially equal to combined widths of the first grid, the first filter unit and the second grid.

* * * * *